(12) United States Patent
Thomas

(10) Patent No.: US 7,112,969 B1
(45) Date of Patent: Sep. 26, 2006

(54) ELECTRICAL INTERCONNECT INTERFACE AND WIRE HARNESS TEST AND TEST DEVELOPMENT SYSTEM AND METHOD

(76) Inventor: Geoffrey L. Thomas, 6942 Windstone La., Stone Mountain, GA (US) 30087

( * ) Notice: Subject to any disclaimer, the term of this patent is extended or adjusted under 35 U.S.C. 154(b) by 0 days.

(21) Appl. No.: 11/357,695

(22) Filed: Feb. 17, 2006

(51) Int. Cl.
*G01R 31/02* (2006.01)

(52) U.S. Cl. ....................... 324/539; 324/503
(58) Field of Classification Search ............... 324/503, 324/539
See application file for complete search history.

(56) References Cited

U.S. PATENT DOCUMENTS 5,514,966 A * 5/1996 Kawamura et al. ......... 324/539
5,623,199 A * 4/1997 Taniguchi et al. ............ 324/66

* cited by examiner

*Primary Examiner*—Vincent Q. Nguyen
(74) *Attorney, Agent, or Firm*—Gardner Groff Santos & Greenwald PC

(57) ABSTRACT

An automated wire testing system includes adapter modules that couple a wire harness under test with an interface test adapter. The interface test adapter (ITA) is coupled to or integrated with an automated wire testing machine. The ITA has a panel into which a standardized connector can be plugged in any of a number of positions. Stimulus/response paths originating at test points on the wire testing machine are distributed over a larger number of contacts on the panel connectors to provide flexibility. Adapter modules for any wire harness can readily be built using the standardized connector.

10 Claims, 6 Drawing Sheets

ELECTRICAL INTERCONNECT INTERFACE AND WIRE HARNESS TEST AND TEST DEVELOPMENT SYSTEM AND METHOD

BACKGROUND OF THE INVENTION

1. Field of the Invention

The present invention relates generally to automated test equipment and, more specifically, to wire testing systems and methods.

2. Description of the Related Art

Automated test equipment (ATE) is computer-controlled equipment that tests electronic devices for functionality or performance. One category of ATE includes automated wire testing machines for testing cables, wire harnesses and other complex wired assemblies. Wire testing machines are also variously referred to in the art to which the invention relates as wire testers and wire analyzers.

The term "wire harness" or "wiring harness" is commonly used to refer to an assembly comprising a bundle of electrical cables with electrical connectors at their ends. Some wire harnesses, such as those used in aircraft, ships, mass transit vehicles and other large vehicles, can be quite large and complex, comprising many individual cables of various lengths, with various types of connectors. Each cable may have many individual wires bundled together that terminate in a connector having a corresponding number of contact pins or receptacles (sockets). The connectors themselves can be quite complex, such as the cylindrical connectors commonly used in military and aerospace vehicles, which typically have from a dozen to well over 100 contacts housed in cylindrical shell with a male or female bayonet or threaded coupling mechanism. Wire harnesses can have myriad network-like topologies, as may be needed to route signals throughout a vehicle or other large system, with branches and sub-branches of various lengths terminating in connectors at various locations.

As illustrated in FIG. 1, testing a typical wire harness 100 presents several challenges. The front panel of a wire testing machine 102 typically has a number of tester interface connectors 104, which may be all of the same type or of several different types. Nevertheless, the connectors of the wire harness to be tested (i.e., the "unit-under-test" or "UUT" 100) may be of still another type that cannot be mated with those of the wire testing machine 102. Also, a wire harness having a combination of some very long cables 106, perhaps extending on the order of ten meters or more, and some much shorter cables 108, is generally unwieldy, making it inconvenient to have all of the connectors 110 of all of the cables plugged into the wire testing machine 102 simultaneously. For these reasons, personnel charged with testing a wire harness typically construct one or more adapter cables 112. An adapter cable 112 will have a connector 114 at one end that mates with a connector 110 on the UUT 100 and a connector 116 at the other end that mates with a tester interface connector 104 on the wire testing machine 102. Each adapter cable 112 can be made as long or as short as may be convenient to extend between the wire testing machine 102 and the point along the length of the UUT 100 at which the corresponding connector 110 is found. The set of one or more adapter cables 112 is specifically designed for the testing of a corresponding wire harness 100 and generally cannot be used to test other wire harnesses having other structures or topologies. Thus, a manufacturer that produces, for example, 25 different wire harnesses, may have 25 corresponding sets of adapter cables 112 for testing them on the manufacturer's wire testing machine 102.

It would be desirable to test complex wire harnesses on a wire testing machine without having to construct, store and use equally complex, cumbersome an d specialized adapter cables. The present invention addresses these problems and deficiencies and others in the manner described below.

SUMMARY OF THE INVENTION

The present invention relates to a system and method for testing a wire harness or similar wired assembly using an apparatus that performs automated wire testing and a plurality of adapter modules. In some embodiments of the invention, the apparatus can comprise a conventional automated wire testing machine in combination with an interface test adapter (ITA) or alternatively, in other embodiments, it can comprise an integrated device or machine that performs the functions of both the automated wire testing machine and the interface test adapter.

In some embodiments of the invention in which the ITA and wire testing machine are separate elements, the ITA can be mechanically mateable with or mountable on the front panel of the wire testing machine. In other such embodiments, cables can connect the ITA to the wire testing machine. The wire testing machine has a group of connectors on its front panel to which testing personnel would conventionally connect the wire harness to be tested, either directly or using adapter cables. When coupled to the wire testing machine, the wire harness is referred to as the unit-under-test (UUT). The connectors on the front panel of the wire testing machine can be referred to as tester interface connectors, and each has a plurality of contacts or test points. As described below, the present invention obviates the conventional use of complex, cumbersome and specialized adapter cables for connecting the UUT to the tester interface connectors.

The ITA has a panel and a second group of connectors, each of which is mounted on the panel. Each contact of each connector of the first group (i.e., the group to which the wire testing machine is connected) is electrically coupled with a contact of a connector of this second group, and at least some of the contacts of the connectors of the first group are coupled to more than one contact of the connectors of the second group (mounted in the ITA panel). Thus, in operation, the test points of the wire testing machine can be electrically coupled to more than one contact of the ITA panel connectors, thereby distributing stimulus signals generated by the wire testing machine and response signals to be received by the wire testing machine over a greater number of ITA panel contacts. This distribution of signals or signal pathways from a smaller number of test points or contacts at the wire testing machine to a larger number of contacts at the ITA panel enhances test configuration flexibility, as will become apparent from the detailed description below.

The term "panel" in this context refers to the area or region in which the connectors of the second group are arranged. The connectors of the second group are all of the same type as each other and are mounted on the panel in a uniform arrangement. Each adapter module has a connector that is of the same type as the connectors of the second group and are thus mateable with each other. The term "uniform" in this context means that the adapter module connectors that mate with the ITA connectors all mate in the same manner, both electrically and mechanically. To ensure uniform mechanical mating, they all have the same mechanical interface. For example, in an exemplary embodiment, the electrical contacts of each ITA panel connector can be arrayed in a rectangular arrangement of N×M contacts, and the connectors themselves arrayed in a rectangular arrangement of P×Q connectors, with each connector immediately adjacent another connector, thereby defining a rectangular array or field of (N)(P)×(M)(Q) contacts. The mechanism may include guide pins, rails or similar structures. The mating connector of each adapter module can be plugged into or otherwise mated with any ITA panel connector in the array because, in this embodiment, each such adapter module connector has the same rectangular array of mating contacts and the same mechanical mating mechanism as every ITA panel connector. In other words, the ITA panel connectors and mating adapter module connectors are made to conform to some suitable standard to provide uniformity.

Each adapter module also has a second connector that is mateable with a connector of the wire harness or UUT. A cable or other suitable electrical pathway couples this second connector with the first connector that plugs into one or more of the ITA panel connectors as described above. In some embodiments of the invention, the signal pathways represented by the wire testing machine Tester interface connectors can be uniformly distributed or distributed in a suitable pattern over some or all of the area of the ITA panel so as to enhance test configuration flexibility. For example, a test point on the wire testing machine can be coupled to every third contact in a rectangular array of ITA panel connectors or to one contact of each connector, thereby making the pathway available to an adapter module regardless of where on the panel it is plugged into. For convenience, each location on the panel into which an adapter module can be plugged may be referred to as a "zone," and the zones numbered or otherwise labeled with suitable indicia on the panel.

A manufacturer of ITAs in accordance with the present invention can provide its customers with kits that comprise connectors conforming to the selected standard so that the customer can quickly and easily build adapter modules to test any desired wire harness. To build an adapter cable, a user need only obtain a connector of a type present in the UUT and couple it with a cable or other suitable electrical pathway to one of the standard connectors provided in the kit. Unlike a conventional adapter cable, which may comprise a complex network of interconnected connectors of different types, an adapter module of the present invention comprises one standard connector coupled with one connector mateable with a connector of the UUT. This arrangement and standardization enables re-use of the adapter cable when the user needs to test a different wire harness that has the same type of connector as previously tested wire harness.

DETAILED DESCRIPTION

Figure 2:
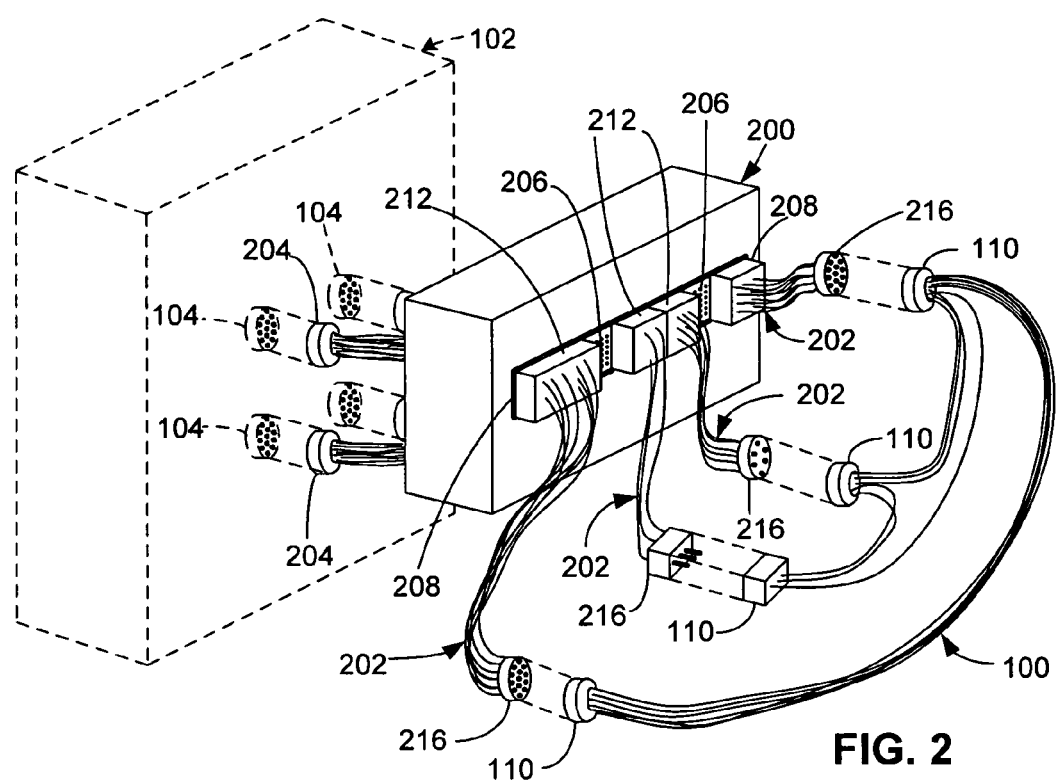
FIG. 2 is a perspective view of the wire testing machine and wire harness of FIG. 1 used with an interface test adapter and adapter modules in accordance with an embodiment of the present invention.

As illustrated in FIG. 2, a testing apparatus comprises an interface test adapter (ITA) 200 and a plurality of adapter modules 202. In the illustrated embodiment of the invention, this testing apparatus couples or interfaces the wire harness unit-under-test (U UT) 100 with a conventional wire testing machine 102. Such automated wire testing machines 102, which include all of the switching and control electronics (not shown for purposes of clarity) needed to perform automated tests upon wire harnesses, are well-known in the art, commercially available from a number of sources, and therefore not described in further detail herein (in this patent specification).

ITA 200 includes a first group of connectors 204 that can be plugged into or otherwise mated or connected to (as indicated by dashed line) connectors 104 of the same type on the front panel of wire testing machine 102. As used herein, the term "type" with reference to a connector refers to the electrical and mechanical configuration of the connector, and only connectors of the same type can be mated. Although most electrical connectors are also typically referred to as either male or female or as plugs or jacks, these designations are not especially relevant to the present invention. For example, in some embodiments of the invention connectors 104 can be male and connectors 204 can be female, and in other embodiments connectors 204 can be male and connectors 104 can be female. For purposes of convenience, the terms "plug," "jack," "plugs into," "is plugged into," etc., are similarly used synonymously and interchangeably and without regard to gender herein unless the context clearly dictates otherwise. In preparation for using the testing apparatus to test UUT 100, the user plugs connectors 204 into the corresponding connectors 104.

Figure 3:
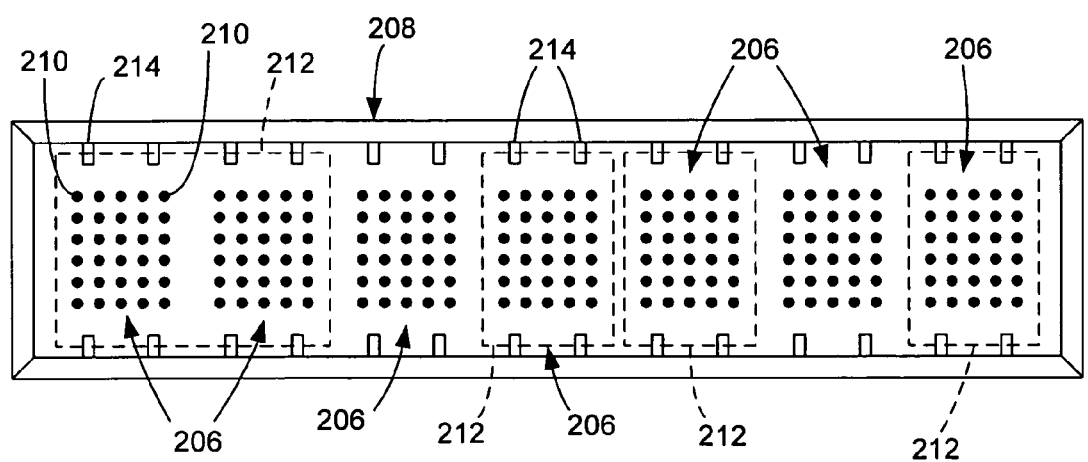
FIG. 3 is a front elevational view of the panel of the interface test adapter of FIG. 2.

ITA 200 also includes a second group of connectors 206 mounted on a panel 208. In further preparation for using the testing apparatus to test UUT 100, the user plugs one or more adapter modules 202 into connectors 206. In the illustrated embodiment, panel 208 is a rectangular connector block in which connectors 206 comprise rectangular arrays of contacts 210. Nevertheless, in other embodiments of the invention it can have other suitable configurations. Each adapter module 202 has a first connector 212 that is mateable with any of connectors 206 on panel 208. Connectors 212 are all of the same type as each other, i.e., the have the same electrical and mechanical interfaces. With further reference to FIG. 3, panel 208 includes mating mechanical interface that allows any of connectors 212 to be plugged into it at any location at which a connector 206 is present. Each connector 206 can be labeled with a "zone" number (not shown for purposes of clarity) or other suitable indicia on panel 208 for convenience of reference. Although in the illustrated embodiment the mechanical interface comprises guide rails 214 distributed along the upper and lower edges of panel 208, with mating guide channels (not shown for purposes of clarity) in connectors 212, in other embodiments the mechanical interface can be of any other suitable type, such as guide posts with mating apertures, etc. (The configuration shown in FIGS. 2–3, in which one such connector 212 is plugged into the leftmost two connectors 206 (e.g., of "Zone 1" and "Zone 2"), and three more connectors 212 are plugged into the connectors 206 of Zones 4, 5 and 7, respectively, with the connectors 206 of Zones 3 and 6 remaining unconnected, is intended merely to be illustrative of one of many such possible configurations.) A suitable retaining mechanism (not shown for purposes of clarity) such as one in which a connector 212 snaps into place when plugged into panel 208 can also be included to inhibit inadvertent removal. Connectors 212 and 206 can have any suitable structure that provides good electrical and mechanical connection. For example, each contact of each connector 212 can have a spring-loaded probe (not shown for purposes of clarity). Note that a connector 212 can span more than one connector 206, as exemplified by the leftmost connector 212 shown in FIGS. 2–3. That is, a single connector 212 can make contact with the electrical contacts of two or more adjacent connectors 206 in panel 208.

Each adapter module 202 further comprises a second connector 216 that is coupled with the corresponding connector 212 via a suitable cable or bundle of wires. Each connector 216 is selected to be of the same type as one of the connectors 110 of UUT 100 so that it can be mated to that connector 110. In further preparation for using the testing apparatus to test UUT 100, the user plugs each connector 110 into a mating connector 216 of one of adapter modules 212.

Users can readily build adapter modules 212 by using a kit provided by the manufacturer of ITA 200 or other source. The kit can include a supply of connectors 212, which, as described above, are all of the same type, i.e., conform to a standard selected by the ITA manufacturer. The supply of connectors 212 can include connectors 212 of different sizes, e.g., some that mate with only one connector 206, others that span two connectors 206, still others that span three connectors 206, etc. The user will generally have access to a supply of connectors 216 that mate with connectors 110 of UUT 100 because the user who is testing the wire harnesses (UUTs) 100 is generally the same party who built them. Such a user may already own or otherwise have access to a conventional wire testing machine 102. It is thus contemplated that in using embodiments of the present invention, a company can purchase ITA 200 along with a kit for building adapter modules 202 to facilitate testing the wire harnesses the company is manufacturing.

To test UUT 100, the user couples UUT 100 to wire testing machine 102 in the manner described above and then programs or otherwise configures wire testing machine 102 to perform tests of the type well-understood in the art. The manner in which wire testing machine 102 can be programmed and otherwise configured and used is also well-understood and is therefore not described herein.

Figure 4:
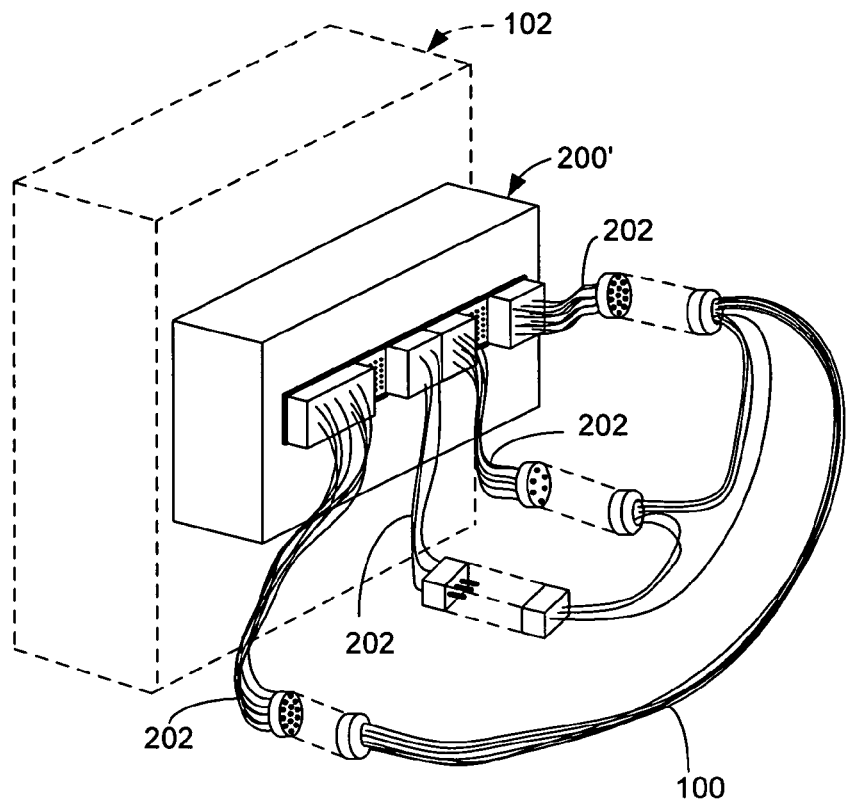
FIG. 4 is a perspective view of the wire testing machine and wire harness of FIG. 1 used with an interface test adapter (ITA) and adapter modules in accordance with an alternative embodiment of the invention, in which the ITA mounts on the wire testing machine.

As illustrated in FIG. 4, in an alternative embodiment of the invention, an ITA 200' is mounted on the front panel of wire testing machine 100. It can be mounted in a user-removable manner so that a user can install ITA 200' in preparation for testing UUT 100 and remove it when testing is completed. The mounting mechanism can have any suitable structure and operate in any suitable manner. The resulting testing apparatus can be used in the same manner as described above with regard to the embodiment illustrated in FIG. 2.

Figure 1:
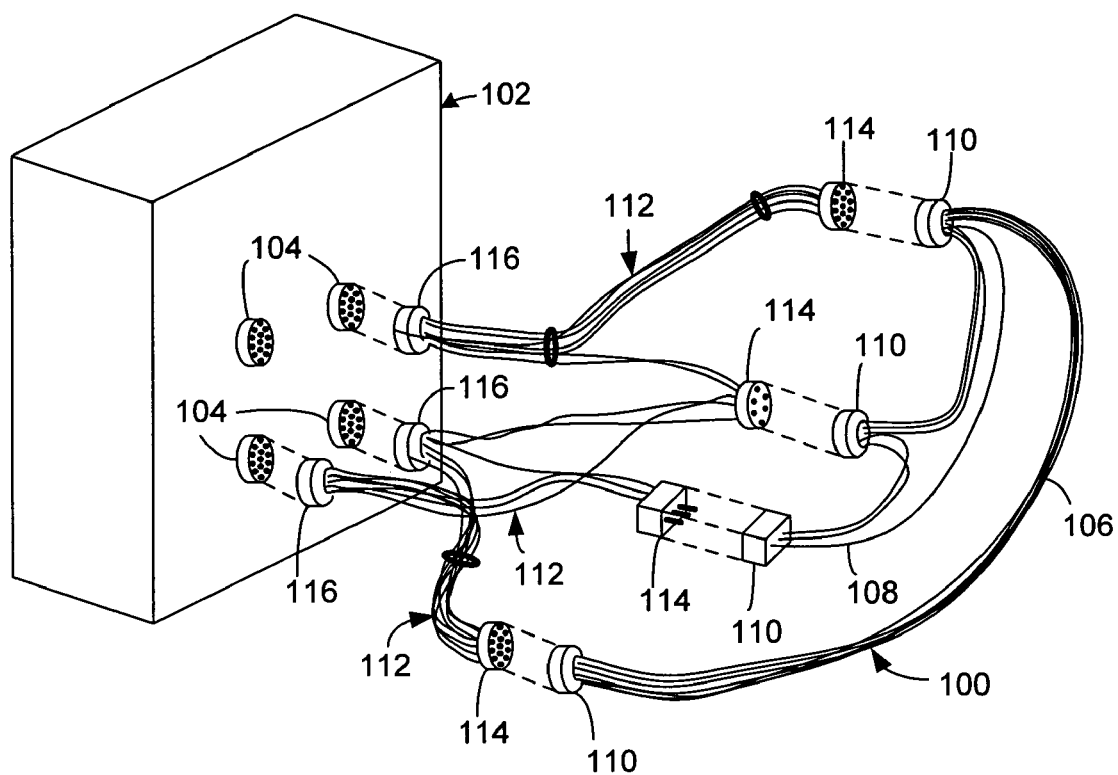
FIG. 1 is a perspective view of a wire testing machine, wire harness, and adapter cables in accordance with the prior art.
Figure 5:
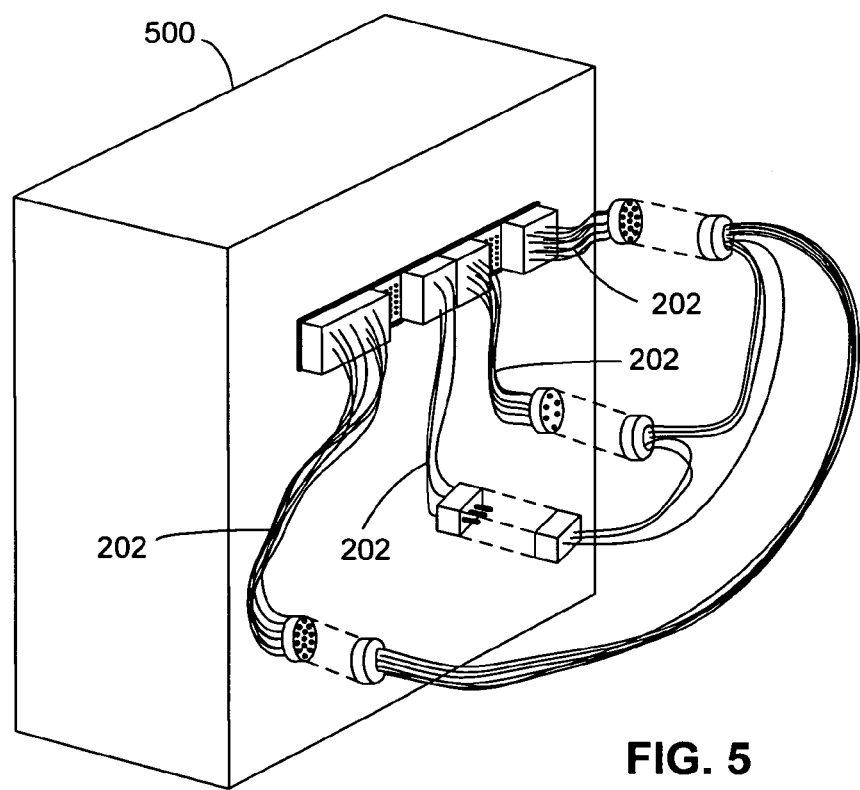
FIG. 5 is a perspective view of the wire testing machine and wire harness of FIG. 1 used with an interface test adapter and adapter modules in accordance with another alternative embodiment of the invention, in which a testing apparatus integrates the wire testing machine and ITA functionality.

As illustrated in FIG. 5, in another alternative embodiment of the invention, elements of ITA 200 (FIG. 1) are integrated with elements of wire testing machine 100 in an integral apparatus 500. That is, the electronic switching, control and coupling elements (not shown) that provide the testing functionality are housed together. As illustrated by the various embodiments described above, elements of the apparatus can be housed together or separately in any suitable arrangement.

Figure 6:
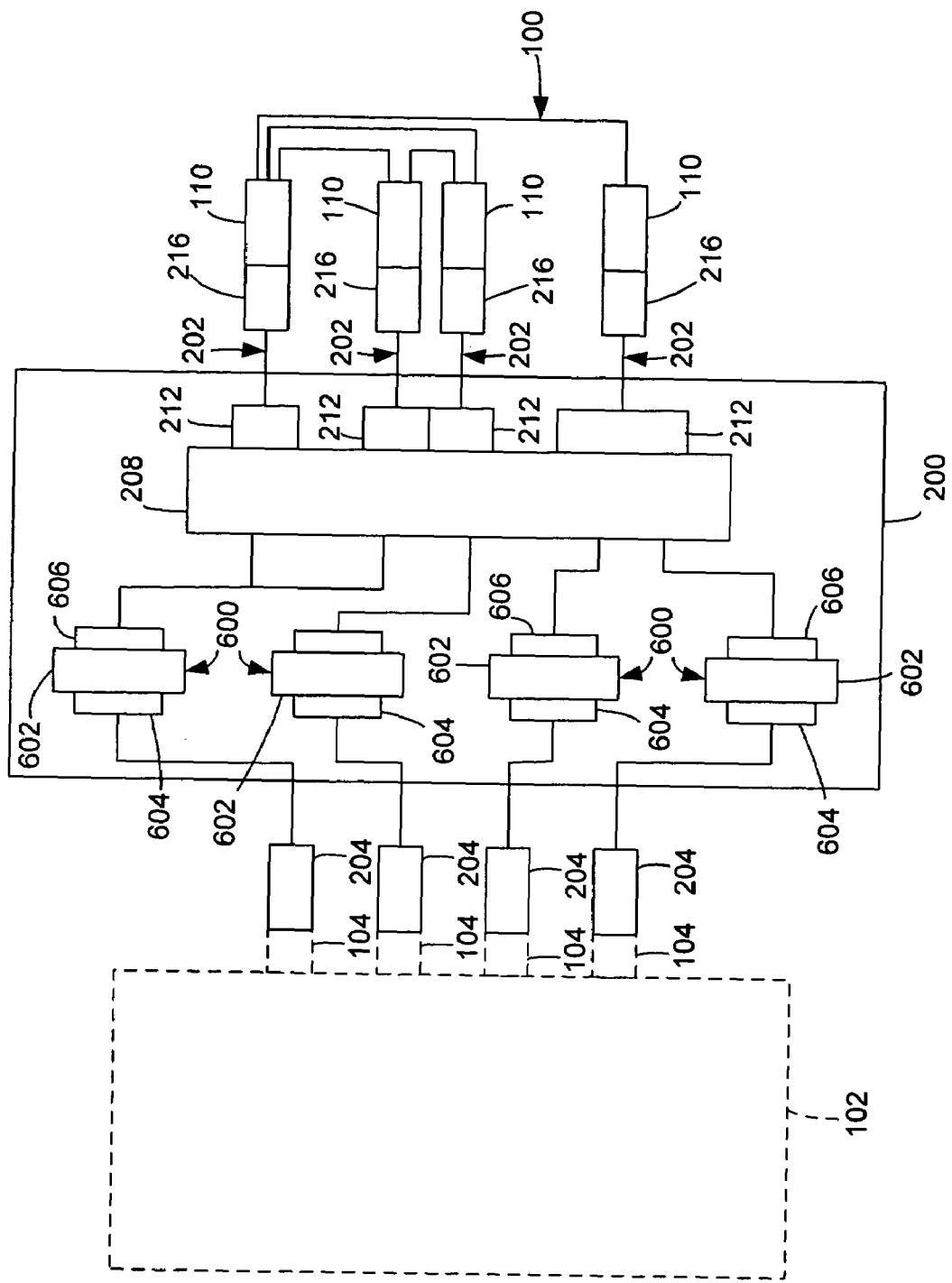
FIG. 6 is a generalized schematic diagram of the system of FIG. 2.

As illustrated in FIG. 6, ITA 200 (FIG. 2) includes, in addition to the elements described above, a number of signal routing units 600 that electrically couple or interface connectors 204 with those of panel 208. Each signal routing unit 600 can have any suitable structure, such as a pair of inter-wired back-to-back connectors 602 into which respective connectors 604 and 606 can be plugged. The electrical signal paths on the board 602 can be configured to match or adapt ITA 200 to the configuration of any wire testing machine 102.

Figure 7:
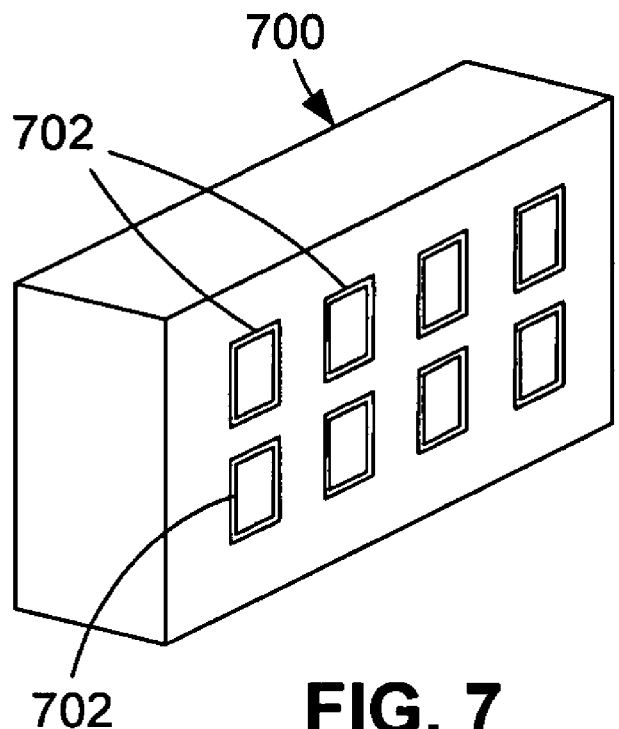
FIG. 7 is a perspective view of an ITA in accordance with still another alternative embodiment of the invention, in which the ITA panel connectors are of the same type but mate with user-replaceable connectors of different types.
Figure 8:
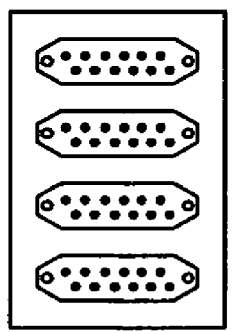
FIG. 8 is a front elevational view of one type of user-replaceable connector for the ITA of FIG. 7.
Figure 9:
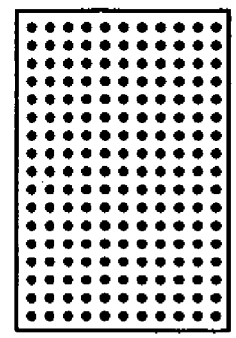
FIG. 9 is a front elevational view of another type of user-replaceable connector for the ITA of FIG. 7.

As illustrated in FIG. 7, in still another form, an ITA 700 includes a number of configurable connectors 702 on its front panel. The manufacturer or user can configure each connector 702 with a selected type of connector, such as the DIN-style connector shown in FIG. 8 or the pin array-style connector shown in FIG. 9. ITA 700 is otherwise functionally the same as ITA 200, described above. Thus, in the manner described above, a user connects ITA 700 to a wire testing machine (not shown in FIG. 7), connects mating adapter modules (not shown in FIG. 7) to connectors 702, and connects a UUT (also not shown in FIG. 7) to the adapter modules.

Figure 10:
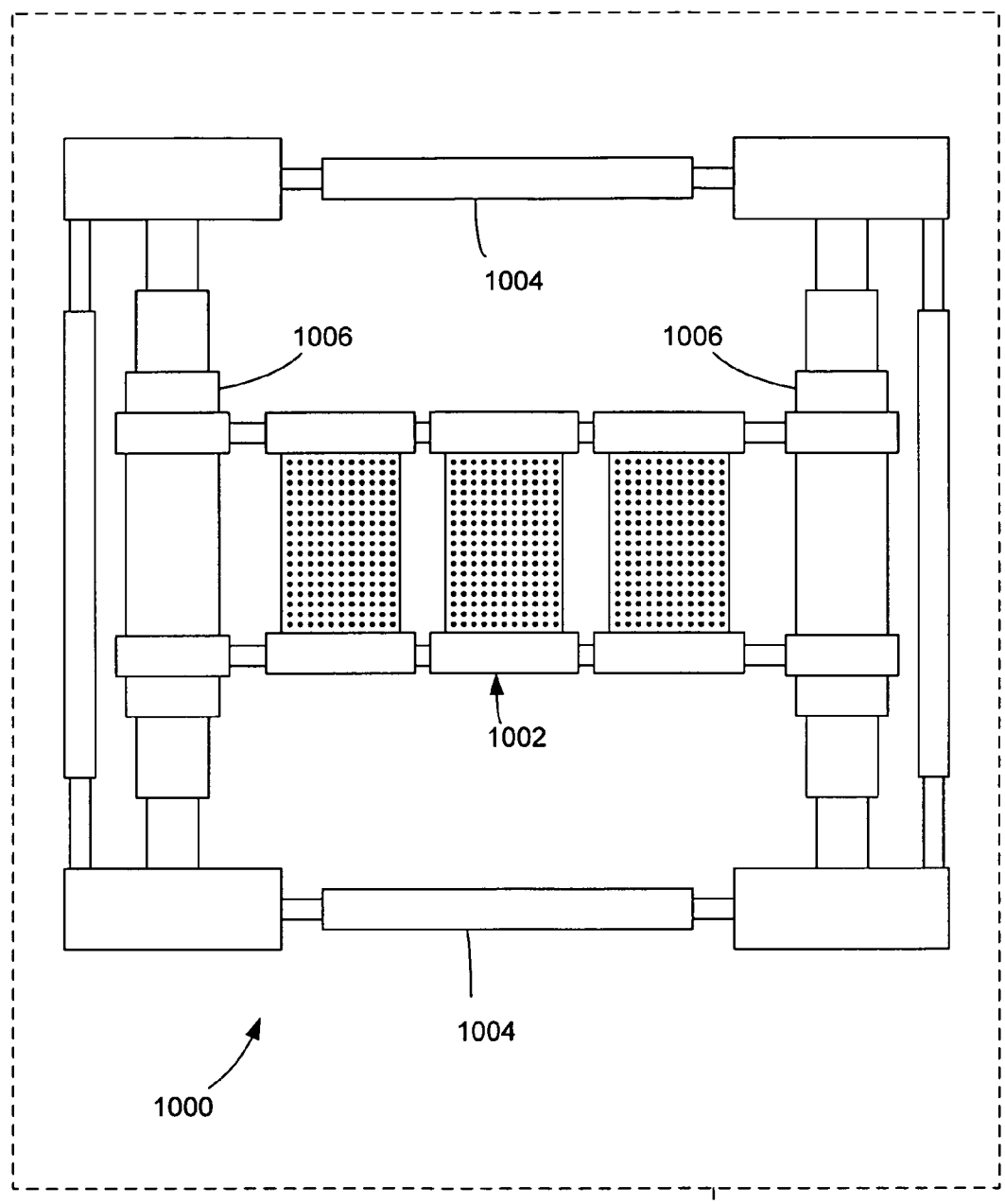
FIG. 10 is a front elevational view of an ITA in accordance with still another alternative embodiment of the invention, in which the ITA mounts to the front panel of the wire testing machine with an adjustable mounting mechanism.

As illustrated in FIG. 10, in an embodiment similar in concept to that of FIG. 4, some or all of the elements constituting an ITA 1000, such as the panel 1002, are mounted on horizontal and vertical telescoping adjustable arms, 1004 and 1006, respectively, which are in turn mounted on the front panel of the wire testing machine 102. The user can adjust arms 1004 and 1006 to align connectors (not shown) on the rear of ITA 1000 (not shown) with those (not shown) on the front panel of wire testing machine 102.

It is to be understood that the present invention is not limited to the specific devices, methods, conditions, or parameters described and/or shown herein, and that the terminology used herein is for the purpose of describing particular embodiments of the invention by way of example only. For example, unless the context clearly dictates otherwise, as used in the specification and the appended claims, a reference to something using the singular article "a," "an," or "the" encompasses embodiments having both one and more than one, the term "or" means "either or both." Likewise, a reference to something "on" something else also encompasses embodiments in which one is "in" the other, and conversely, a reference to something "in" something else also encompasses embodiments in which one is "on" the other. "Coupled" means connected via zero or more intermediate elements. Also, a reference to a particular numerical value includes at least that particular value. In addition, any methods or processes set forth herein are not intended to be limited to the sequence of steps set forth but also encompass other sequences, unless expressly stated otherwise. With regard to the claims, no claim is intended to invoke the sixth paragraph of 35 U.S.C. Section 112 unless it includes the term "means for" followed by a participle.

It will be apparent to those skilled in the art that various modifications and variations can be made to this invention without departing from the spirit or scope of the invention. Thus, it is intended that the present invention cover all modifications and variations of this invention that come within the scope of one or more claims and their equivalents.

What is claimed is:

1. A system for testing a wire harness using an automated wire testing machine having a plurality of tester interface connectors, each tester interface connector comprising a bundled plurality of test points, the system comprising:

an interface test adapter having a first group of a plurality of connectors and a second group of a plurality of connectors, each connector of the first group mateable with a Tester interface connector of the wire testing machine, each connector of the second group being mounted on a panel of the interface test adapter in a uniform arrangement and of a same type as all other connectors of the second group, wherein each contact of each connector of the first group is electrically coupled with a contact of a connector of the second group, and at least some of the contacts of the connectors of the first group are coupled to a plurality of contacts of connectors of the second group; and a plurality of adapter modules, each adapter module having a first connector of the same type as the connectors of the second group for mating with at least one of the connectors of the second group on the panel, each first connector of each adapter module having a mechanical interface mateable with the panel and of the same type as the mechanical interface of all other first connectors of all other adapter modules, each adapter module having a second connector mateable with a wire harness connector, and each adapter module having a cable coupling the first connector with the second connector.

2. The system claimed in claim 1, wherein the interface test adapter is mechanically mateable with a front panel of the wire testing machine.

3. The system claimed in claim 2, wherein the interface test adapter has an adjustable mounting mechanism for mechanically mating the interface test adapter with the front panel of the wire testing machine.

4. The system claimed in claim 1, wherein:
the second group includes a plurality of connectors mounted on the panel in an array arrangement; and
at least one of the adapter modules has a first connector mateable simultaneously with a plurality of connectors of the second group.

5. The system claimed in claim 4, wherein:
each connector of the second group has a rectangular array of contacts; and
at least one of the adapter modules has a first connector having a plurality of rectangular arrays of contacts mateable simultaneously with a plurality of connectors of the second group.

6. A method for interfacing a wire harness to an automated wire testing machine having a plurality of tester interface connectors, each tester interface connector comprising a bundled plurality of test points, the method comprising the steps of:
mating an interface test adapter with a wire testing machine, the interface test adapter having a first group of at least one connector and a second group of at least one connector, each connector of the second group being mounted on a panel in a uniform arrangement, and of a same type as all other connectors of the second group, wherein the interface test adapter is mated with the wire testing machine by mating each connector of the first group with a corresponding Tester interface connector of the wire testing machine, wherein each contact of each connector of the first group is electrically coupled with a contact of a connector of the second group, and at least some of the contacts of the connectors of the first group are coupled to a plurality of contacts of connectors of the second group;

providing a plurality of adapter modules, each adapter module corresponding to one connector of the wire harness UUT and having a first connector, a second connector, and an adapter module cable coupling the first connector with the second connector, each first connector of each adapter module having a mechanical interface mateable with the panel and of the same type as the mechanical interface of all other first connectors of all other adapter modules;

mating a connector of the wire harness UUT with the second connector of a corresponding one of the adapter modules; and mating the first connector of each adapter module with at least one of the connectors of the second group on the panel of the interface test adapter.

7. The method claimed in claim 6, wherein the step of providing a plurality of adapter modules comprises using an adapter module kit corresponding to the interface test adapter, the adapter module kit comprising a plurality of first connectors of uniform type, the step of using an adapter module kit comprising providing the adapter module cable, connecting a first end of the adapter module cable to one of the first connectors, and connecting a second end of the adapter module cable to a connector mateable with the connector of the wire harness UUT.

8. The method claimed in claim 6, wherein the step of mating the first connector of each adapter module with at least one of the connectors of the second group on the panel of the interface test adapter comprises mating at least one of the adapter modules simultaneously with a plurality of connectors of the second group.

9. The method claimed in claim 6, wherein the step of mating an interface test adapter with a wire testing machine comprises mechanically mating the interface test adapter with the wire testing machine.

10. A system for testing a wire harness, comprising:
an integrated wire testing apparatus having automated wire testing switching and control electronics and a group of a plurality of connectors, each connector of the group being mounted on a panel of the integrated wire testing apparatus in a uniform arrangement and of a same type as all other connectors of the group; and a plurality of adapter modules, each adapter module having a first connector of the same type as the connectors of the group for mating with at least one of the connectors of the group on the panel, each first connector of each adapter module having a mechanical interface mateable with the panel and of the same type as the mechanical interface of all other first connectors of all other adapter modules, each adapter module having a second connector mateable with a wire harness (unit-under-test) connector, and each adapter module having a cable coupling the first connector with the second connector.

* * * * *